United States Patent
Kashiura

(10) Patent No.: US 7,042,059 B2
(45) Date of Patent: May 9, 2006

(54) OPTICAL SEMICONDUCTOR DEVICE AND METHOD FOR MANUFACTURING OPTICAL SEMICONDUCTOR DEVICE

(75) Inventor: Yukiko Kashiura, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/915,385

(22) Filed: Aug. 11, 2004

(65) Prior Publication Data
US 2005/0006715 A1     Jan. 13, 2005

Related U.S. Application Data

(62) Division of application No. 10/320,684, filed on Dec. 17, 2002, now Pat. No. 6,791,153.

(30) Foreign Application Priority Data
Mar. 8, 2002     (JP) .............................. 2002-063188

(51) Int. Cl.
*H01L 31/075* (2006.01)
(52) U.S. Cl. .................. 257/458; 257/656; 438/48
(58) Field of Classification Search ............... None
See application file for complete search history.

(56) References Cited

U.S. PATENT DOCUMENTS

| | | | |
|---|---|---|---|
| 4,831,430 A | 5/1989 | Umeji | |
| 4,906,583 A * | 3/1990 | Kagawa et al. | ............. 438/91 |
| 5,554,489 A | 9/1996 | Ishibashi et al. | |
| 6,060,732 A | 5/2000 | Murakami et al. | |
| 2002/0000510 A1* | 1/2002 | Matsuda | ............. 250/214.1 |

FOREIGN PATENT DOCUMENTS

| | | |
|---|---|---|
| JP | 4-271173 | 9/1992 |
| JP | 5-75092 | 3/1993 |
| JP | 5-82827 | 4/1993 |
| JP | 7-183561 | 7/1995 |
| JP | 8-228019 | 9/1996 |
| JP | 11-40790 | 2/1999 |

* cited by examiner

*Primary Examiner*—Nathan J. Flynn
*Assistant Examiner*—Scott R. Wilson
(74) *Attorney, Agent, or Firm*—Oblon, Spivak, McClelland, Maier & Neustadt, P.C.

(57) ABSTRACT

An optical semiconductor device includes: a photo detector section which includes: a first semiconductor layer of a first conductivity type formed on a surface of a semiconductor substrate of the first conductivity type, a second semiconductor layer of a second conductivity type formed on a surface of the first semiconductor layer, and an antireflection film formed on a surface of the second semiconductor layer and preventing reflection of incident light; and a circuit element section which includes: a circuit element formed on the second semiconductor layer on the semiconductor substrate, and a passivation film covering an uppermost electrode layer among electrode layers constituting the circuit element and formed out of a same material as a material of the antireflection film.

20 Claims, 4 Drawing Sheets

100

200

OPTICAL SEMICONDUCTOR DEVICE AND METHOD FOR MANUFACTURING OPTICAL SEMICONDUCTOR DEVICE

CROSS-REFERENCE TO RELATED APPLICATIONS

This application is a Divisional of U.S. patent application Ser. No. 10/320,684, filed Dec. 17, 2002 now U.S. Pat. No. 6,791,153, and based upon and claims the benefit of priority from the prior Japanese Patent Application No. 2002-63188, filed on Mar. 8, 2002. The contents of these applications are incorporated herein by reference in their entirety.

BACKGROUND OF THE INVENTION

1. Field of the Invention

The present invention relates to an optical semiconductor device and a method for manufacturing the optical semiconductor device.

2. Related Background Art

A photodiode of a PIN structure is conventionally employed as a photo detector which converts an optical signal used in optical communication or a DVD and the like into an electrical signal.

The PIN-type photodiode has a structure in which a so-called i (intrinsic) layer consisting of a semiconductor having a relatively low impurity concentration is put between p and n semiconductors having relatively high impurity concentrations.

A bipolar transistor, a capacitor, a resistance, a MOSFET and the like are used as signal-processing circuit elements which process an electrical signal from the photo-detector.

An optical semiconductor device is conventionally formed by hybridizing a PIN photodiode and signal-processing circuit elements formed on different semiconductor substrates or semiconductor chips, respectively (such optical semiconductor device will be referred to as "hybrid-optical semiconductor device" hereinafter).

Further, there is known an optical semiconductor device which has a PIN photodiode and a signal-processing circuit formed on the same semiconductor substrate or semiconductor chip (such optical semiconductor device will be referred to as "single-substrate-type optical semiconductor device" hereinafter).

The single-substrate-type optical semiconductor device has fewer parts than those of the hybrid-optical semiconductor device in an assembly process and requires fewer steps in the assembly process. Therefore, the single-substrate-type optical semiconductor device can reduce manufacturing costs more than the hybrid-optical semiconductor device. Further, the single-substrate-type optical semiconductor device does not require a bonding wire that connects from a semiconductor chip on which a PIN photodiode is formed to a semiconductor chip on which a signal-processing circuit is formed. Therefore, the single-substrate-type optical semiconductor device can resist external electromagnetic noise better than the hybrid-optical semiconductor device. As a consequence, the single-substrate-type optical semiconductor device is more advantageous than the hybrid-optical semiconductor device.

FIG. 8 is a schematic enlarged cross-sectional view of a conventional single-substrate-type optical semiconductor device. As shown therein, a p⁻-type epitaxial layer 12 is formed on a p-type semiconductor substrate 10. An n-type epitaxial layer 16 is formed on the epitaxial layer 12. An insulating layer 18, an insulating layer 20, an electrode layer 22, a passivation film 24 and a passivation film 26 are sequentially provided on the epitaxial layer 16 in this order.

On the epitaxial layers 12 and 16, various diffused layers 14, 40, 42 and 44 are provided to form a photodiode section 50 and a signal-processing circuit section 60. In addition, electrodes 28 and 29 connected to the diffused layers through the insulating layer 18 are formed on the epitaxial layers 16.

The electrode layer 22 is a metal layer electrically connected to one of the electrodes formed on the epitaxial layer 16 and also functions as a light-shielding film which shields the signal-processing circuit section from light. Therefore, in the optical semiconductor device 200, the electrode layer 22 is not formed in the photodiode section 50 and light is allowed to be incident only on this photodiode section 50.

However, the insulating layers 18 and 20 and the passivation films 24 and 26 used to manufacture the signal-processing circuit section 60, the electrode 28 and the like are formed on the surface of the epitaxial layer 16 in the photodiode section 50. Because of the presence of the insulating layers 18 and 20 and the passivation films 24 and 26, most of the incident light incident on the photodiode section 50 is reflected. As a result, the quantity of light incident on portions below the surface of epitaxial layer 16 is decreased. Due to this, the photo sensitivity of the optical semiconductor device 200 disadvantageously deteriorates.

Furthermore, the film formed on the surface of the epitaxial layer 16 in the photodiode section 50 is a multilayer film which consists of the insulating films 18 and 20 and the passivation films 24 and 26 different from one another in property and thickness. Since the respective films of this multilayer film are formed in different manufacturing steps from one another, the material, property and film thickness vary among these films. As a result, the reflectance of the incident light incident on the photodiode section 50 is not kept constant. Due to this, there occurs the problem that the photo sensitivity of the optical semiconductor device 200 has a disadvantageously large variation.

As stated above, the reflectance for reflecting the incident light incident on the photodiode section 50 is largely influenced by the materials, properties and thicknesses of the films covering the surface of the epitaxial layer 16. However, it is difficult to form the films having different materials, properties and thicknesses on the epitaxial layer 16 so as to minimize reflectance in view of the refractive index of the epitaxial layer (e.g., the refractive index of silicon≈3.44) and the wavelength of the incident light.

In addition, Japanese Patent Application Publication No. 4-271173 discloses an optical semiconductor device having a dielectric thin film and an antireflection film which have common properties and thickness, and which are manufactured in a common manufacturing step. The dielectric thin film is used between the electrodes of the capacitor of a peripheral circuit element. The antireflection film is used in a photo detector.

In the optical semiconductor device disclosed in Publication No.HEI4-271173 (1992), however, the thickness of the antireflection film is a factor that determines the capacitance of the capacitor. Therefore, the thickness of the antireflection film is limited by the capacitance of the capacitor. If the thickness of the antireflection film is set at an optimum thickness in accordance with the wavelength of incident light, the areas of the electrodes of the capacitor have to be changed so as to obtain a desired capacitance.

Furthermore, in the optical semiconductor device disclosed in Publication No. 4-271173, the antireflection film of the photo detector is formed when the dielectric thin film used between the electrodes of the capacitor is formed. Due to this, such films as passivation films are formed on the antireflection film of the photo detector. As a result, there occurs the problem that in order to control the reflectance in the photo detector, it is disadvantageously necessary to control not only the thickness of the antireflection film but also that of the passivation films on the antireflection film.

Therefore, it is desired to provide an optical semiconductor device which has a relatively high photo sensitivity and which can reduce the variation of photo sensitivity even if a photo detector and a circuit element are formed on the same semiconductor substrate, and to provide a method for manufacturing the optical semiconductor device.

It is also desired to provide an optical semiconductor device which can control a photo sensitivity relatively easily without influencing a circuit element even if a photo detector and a circuit element are formed on the same semiconductor substrate, and to provide a method for manufacturing the optical semiconductor device.

It is further desired to provide a method for manufacturing an optical semiconductor device which enables a photo detector and a circuit element having relatively high photo sensitivity and small variation in photo sensitivity to be manufactured on the same semiconductor substrate, and to provide the optical semiconductor device.

SUMMARY OF THE INVENTION

An optical semiconductor device according to an embodiment of the present invention, the optical semiconductor device comprises: a photo detector section including a first semiconductor layer of a first conductivity type formed on a surface of a semiconductor substrate of the first conductivity type, a second semiconductor layer of a second conductivity type formed on a surface of the first semiconductor layer, and an antireflection film formed on a surface of the second semiconductor layer and preventing reflection of incident light; and a circuit element section including a circuit element formed on the second semiconductor layer on the semiconductor substrate, and a passivation film covering the circuit element and having a passivation film formed out of a same material as a material of the antireflection film.

A method for manufacturing the optical semiconductor device according to the embodiment of the present invention, is the method for manufacturing the optical semiconductor device constituted so that a photo detector section which receives light and generates a photocurrent and a circuit element section which processes a signal based on the photocurrent from at least the photo detector section are formed on a same semiconductor substrate, the method comprising: a step of forming a first semiconductor layer of a first conductivity type on a surface of the semiconductor substrate of the first conductivity type; a step of forming a second semiconductor layer of a second conductivity type on a surface of the first semiconductor layer; a diffused layer formation step of selectively forming diffused layers in the second semiconductor layer in the photo detector section and the circuit element section; an insulating film formation step of depositing a first insulating film on the second semiconductor layer; an exposure step of exposing the second semiconductor layer in a light-receiving region which receives the light in the photo detector section; and a passivation film formation step of forming an antireflection film which prevents reflection of incident light on the second semiconductor layer in the light-receiving region, and forming a passivation film which is made of a same material as a material of the antireflection film and covers the circuit element above the first insulating film.

DETAILED DESCRIPTION OF THE INVENTION

An embodiment according to the present invention will be described hereinafter with reference to the drawings. It is noted, however, that the embodiment is not intended to limit the present invention. In addition, in the embodiment described below, even if an n-type semiconductor is employed in place of a p-type semiconductor and a p-type semiconductor is employed in place of an n-type semiconductor, the same advantages as those of the present invention or the embodiment can be obtained.

Figure 1:
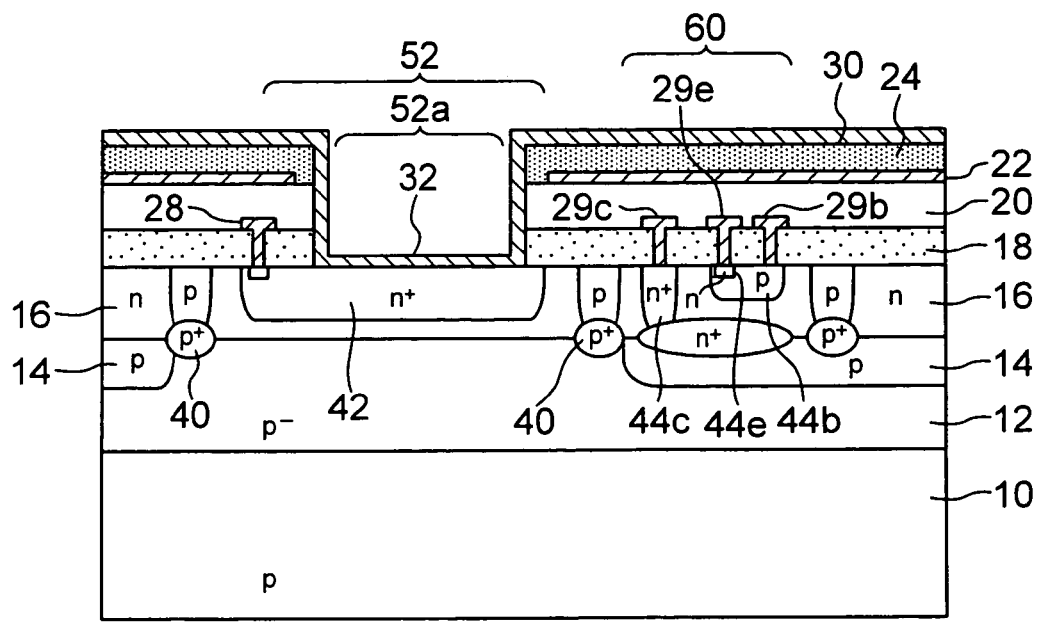
FIG. 1 is a schematic partially enlarged cross-sectional view of an optical semiconductor device 100 in an embodiment according to the present invention.

FIG. 1 is a schematic partially enlarged cross-sectional view of an optical semiconductor device 100 in an embodiment according to the present invention. The optical semiconductor device 100 includes a p-type semiconductor substrate 10, a p$^-$-type epitaxial layer 12 and an n-type epitaxial layer 16. The p$^-$-type epitaxial layer 12 is higher in specific resistance than the semiconductor substrate 10. In this embodiment, the epitaxial layer 12 is a semiconductor layer formed by epitaxially growing silicon which contains p-type impurities. The epitaxial layer 16 is formed to provide a pn junction on the surface of the epitaxial layer 12. In this embodiment, the epitaxial layer 16 is a semiconductor layer formed by epitaxially growing silicon which contains n-type impurities.

In this embodiment, each of the semiconductor substrate 10, the epitaxial layer 12 and the epitaxial layer 16 consist of silicon. However, alternatively, these may be semiconductors that contain germanium, carbon or gallium.

The optical semiconductor device 100 maybe divided into two sections, i.e., a photo detector section 52 which receives light and generates a photocurrent, and a signal-processing circuit section 60 which processes a signal based on the photocurrent generated by the photo detector section 52. In the epitaxial layer 16, a p$^+$-type isolation 40 is formed between the photo detector section 52 and the signal-processing circuit section 60 so as to isolate the photo detector section 52 from the signal-processing circuit section 60.

The photo-detector section 52 includes an n⁺-type lead layer 42 and a cathode electrode 28 connected to the lead layer 42 in the epitaxial layer 16 in order to lead out the photocurrent generated by the photo-detector section 52. An antireflection film 32 is formed on the surface of the epitaxial layer 16 in a light-receiving region 52a of the photo detector section 52 in order to prevent the reflection of incident light incident on the light-receiving region 52a. The light-receiving region 52a is a region receiving the light in the photo detector section 52. The antireflection film 32 is directly formed on the surface of the epitaxial layer 16 and no other film is present above the antireflection film 32. FIG. 1 shows a PIN photodiode as one example of the photo detector section 52. However, alternatively, a PN photodiode may be used as another example of the photo detector section 52.

The antireflection film 32 is formed out of a dielectric material such as a silicon-nitride film or a silicon-oxide film. The silicon-nitride film can resist water content better than the silicon-oxide film and has the effect of being a passivation film. Therefore, the silicon-nitride film is particularly preferable as the antireflection film 32.

The signal-processing circuit section 60 includes various semiconductor elements to process the signal from the photo detector. FIG. 1 shows one bipolar transistor as one example of the semiconductor element. The other examples of the semiconductor elements formed in the signal-processing circuit section 60 involve a resistance, a capacitor, a MOSFET and the like.

Diffused layers necessary to form the signal-processing circuit section 60 are formed in the epitaxial layer 16. In this embodiment, for example, a base layer 44b, an emitter layer 44e and a collector layer 44c of the bipolar transistor are formed.

On the epitaxial layer 16, interlayer-insulating films, including insulating films 18 and 20, are formed so as to form a base electrode 29b, an emitter electrode 29e and a collector electrode 29c which have contact with the base layer 44b, the emitter layer 44e and the collector layer 44c, respectively. The base electrode 29b, the emitter electrode 29e and the collector electrode 29c are each formed out of metal such as aluminum or copper. The insulating films 18 and 20 are each formed out of a silicon oxide film. The insulating films 18 and 20 are employed to insulate the electrodes 29b, 29e and 29c from one another and to insulate the electrodes 29b, 29e and 29c from an electrode layer 22 to be described later.

Further, the electrode layer 22 is formed on the insulating film 20. The electrode layer 22 is a metal layer electrically connected to one of the electrodes formed on the epitaxial layer 16 and also functions as a light-shielding film which shields the signal-processing circuit from light. It is thereby possible to prevent the semiconductor elements formed in the signal-processing circuit section 60 from malfunctioning. The electrode layer 22 is one electrode layer of a multilayer wiring made of metal. Passivation films 24 and 30 are further formed on the electrode layer 22.

On the epitaxial layer 16 in the photo detector section 52 except for the light-receiving region 52a, the interlayer insulating films including the insulating films 18 and 20 are also formed to form a cathode electrode 28. The cathode electrode 28 is made of metal such as aluminum or copper or the like. Further, the electrode layer 22 is formed on the insulating film 20, and the passivation films 24 and 30 are formed on the electrode layer 22 as in the case of the epitaxial layer 16 in the signal-processing circuit section 60.

The passivation film 30 and the antireflection film 32 serve as passivation films which cover the outermost layers in the signal-processing circuit section 60 and the photo detector section 52, respectively. In addition, the passivation film 30 is formed out of the same material as that of the antireflection film 32. In this embodiment, the passivation film 30 and the antireflection film 32 are each formed out of a silicon nitride film. The passivation film 30 and the antireflection film 32 also cover a sidewall which consists of the insulating films 18 and 20 and the passivation film 24 and which is provided on a boundary between the signal-processing circuit section 60 and the photo detector section 52. In other words, the passivation film 30 and the antireflection film 32 are continuous to each other and formed out of the same single layer film.

The operation of the optical semiconductor device 100 in this embodiment as well as the advantages of the operation will now be described.

Light is incident on the light-receiving region 52a of the photo detector section 52. This incident light reaches a depletion layer formed in a pn junction between the p⁻-type epitaxial layer 12 and the n-type epitaxial layer 16 and generates a photocurrent. The photocurrent generated in the pn junction section is led out from the cathode electrode 28 through the lead layer 42 or an anode electrode (not shown) electrically connected to the epitaxial layer 12. Then, the photocurrent is processed by the signal-processing circuit section 60 as an electrical signal.

The response rate of the photo detector is restricted by a CR time constant which is the product of the capacitance (C) and the resistance component (R) of the photo detector, and is restricted by the running time of optically-excited carriers. In this embodiment, the photo detector section 52 is a PIN photodiode which has a low impurity concentration in the epitaxial layer 12. The depletion layer, therefore, easily spreads in the epitaxial layer 12 at a low bias voltage. If the thickness of the epitaxial layer 12 is appropriately set, it is possible to suppress the capacitance and resistance element of the photo detector and to lower the CR time constant. Further, since the depletion layer spreads at a low bias voltage, it is possible to easily increase a field intensity in the depletion layer and to accelerate the running rate of the optically-excited carriers. As a result, the optical semiconductor device 100 can deal with a high frequency signal.

Figure 8:
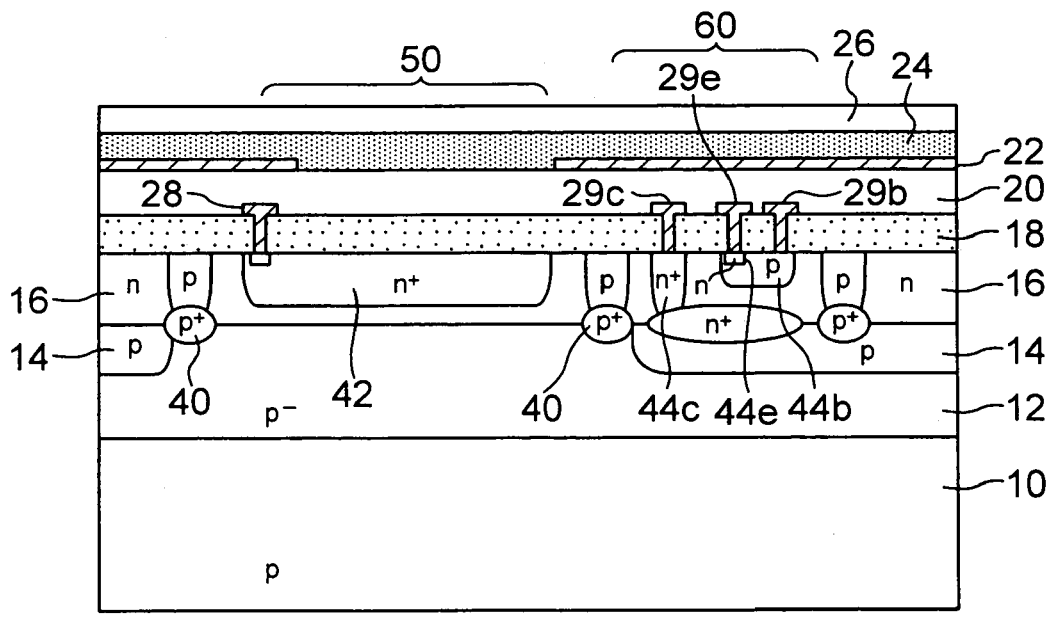
FIG. 8 is a schematic enlarged cross-sectional view of a conventional single-substrate-type optical semiconductor device 200.

In the conventional optical semiconductor device 200 shown in FIG. 8, the insulating films 18 and 20 and the passivation films 24 and 26 formed in the photodiode 50 reflect most of the incident light. That is, the reflectance of the multilayer which consists of the insulating films 18 and 20 and the passivation films 24 and 26 is high. In addition, because of the variation of the respective constituent films of the multilayer film, reflectance has great variation.

Generally, if a dielectric film which has a thickness d satisfying an expression 1 is formed on a semiconductor material, the reflectance R of the surface of the dielectric film may possibly be a minimum reflectance. The minimum reflectance R is given by an expression 2.

$$d = (\lambda/4n_1)*(2m+1) \quad \text{(Expression 1)}$$

$$R = (n_0 n_2 - n_1^2)^2 / (n_0 n_2 + n_1^2)^2 \quad \text{(Expression 2)}$$

In the expressions 1 and 2, symbol $\lambda$ denotes the wavelength of incident light in vacuum. Symbol m denotes an integer not smaller than 0. Symbol $n_0$ denotes the refractive index of a medium propagated by the light before the light is incident on the dielectric film. This medium is often nitrogen ($N_2$) and the refractive index $n_0$ is about 1. In this embodiment, it is assumed that $n_0$ is 1. Symbol $n_1$ denotes the refractive index of the dielectric film. Symbol $n_2$ denotes the refractive index of the semiconductor material.

Conventionally, each of the insulating films 18 and 20 and the passivation films 24 and 26 consists of the combination of a silicon oxide film and a silicon nitride film. The reflectance of the multilayer film which consists of the films 18, 20, 24 and 26 experimentally varies in a range of 10% to 40%. That is, the reflectance of the conventional photodiode 50 is high and the variation of the reflectance thereof is large. In this case, the photo sensitivity of the conventional optical semiconductor device 200 varies from about 0.3 A/W (ampere/watt) to about 0.43 A/W for light having a wavelength of 650 nm. Here, the photo sensitivity is defined as a ratio of a photocurrent (A) to an incident light power (W).

On the other hand, in the optical semiconductor device 100 in this embodiment according to the present invention, only the antireflection film 32 is formed on the epitaxial layer 16 in the photo detector section 52. In this embodiment, the epitaxial layer 16 is a silicon layer and has a refractive index ($n_2$) of about 3.44. The antireflection film 32 is a silicon nitride film and has a refractive index ($n_1$) of about 2.05. The incident light has a wavelength λ of 650 nm. The medium propagated by the light before the light is incident on the antireflection film 32 is nitrogen ($N_2$). Therefore, $n_0$ is about 1. In this case, the thickness of the antireflection film 32 which satisfies the expression 1 is about 79.3 nm (m=0).

Using the expression 2, the reflectance R of the antireflection film 32 at this moment is calculated as about 0.99%. As can be seen, the reflectance of the antireflection film 32 of the photo detector in this embodiment is far lower than that of the conventional multilayer film. In addition, even if the thickness of the antireflection film 32 varies in a range of about 79.3 nm±10%, the reflectance R is always about 4% or less. Obviously, the variation of the reflectance is smaller than that in the conventional art.

The antireflection film 32 which is formed out of a silicon nitride film of 70 nm to 90 nm is experimentally formed on the epitaxial layer 16 made of silicon. As a result, the photo sensitivity is in a range from about 0.49 A/W to about 0.50 A/W. Therefore, the photo sensitivity of the optical semiconductor device 100 in this embodiment improves beyond that of the conventional optical semiconductor device. This is because the reflectance is lower than that of the conventional reflectance and the quantity of light incident on the photo detector increases.

Under the same conditions as those in this embodiment, when quantum efficiency is 100% in theory, the photo sensitivity is 0.524 A/W. That is, the optical semiconductor device 100 in this embodiment can obtain the photo sensitivity at quantum efficiency of about 95%. The quantum efficiency is the ratio of the number of charges which generate a photocurrent to the light quantum of light incident on a photo detector.

Since no other film is present above the antireflection film 32 and since the antireflection film 32 is a single layer film, it is possible to control reflectance and photo sensitivity by controlling the thickness of the antireflection film 32. In this embodiment, therefore, it is possible to easily control the reflectance and the photo sensitivity of the optical semiconductor device.

Since the antireflection film 32 is a single layer film, it is possible to easily make the thickness of the antireflection film 32 thin. Normally, it is considered that the variation range of a film thickness is about 10% of a desired film thickness. The variation of the film thickness is made small because of the thin antireflection film 32. As a result, the reflectance of the antireflection film 32 is stabilized without causing variation thereof. In other words, the photo sensitivity of the optical semiconductor device 100 is stabilized.

The passivation film 30 and the antireflection film 32 are passivation films which cover the outermost layers in the signal-processing circuit section 60 and the photo detector section 52, respectively. In addition, the passivation film 30 and the antireflection film 32 are formed out of the same single layer film (silicon nitride film in this embodiment) and continuous to each other. It is, therefore, possible to form the passivation film 30 and the antireflection film 32 in the same manufacturing step in the manufacturing process of the optical semiconductor device 100.

Furthermore, since the passivation film 30 and the antireflection film 32 are continuous to each other, the passivation film 30 and the antireflection film 32 serve as effective passivation films for semiconductor elements which are present below the passivation film 30 and the antireflection film 32. That is, the antireflection film 32 has not only the antireflection function for preventing the reflection of the incident light, but also the function of a passivation film for the semiconductor elements.

Next, a method for manufacturing the optical semiconductor device 100 in this embodiment according to the present invention will be described. FIGS. 2 to 6 are partially enlarged cross-sectional views showing the method for manufacturing the optical semiconductor device in this embodiment in the order of manufacturing steps.

Figure 2:
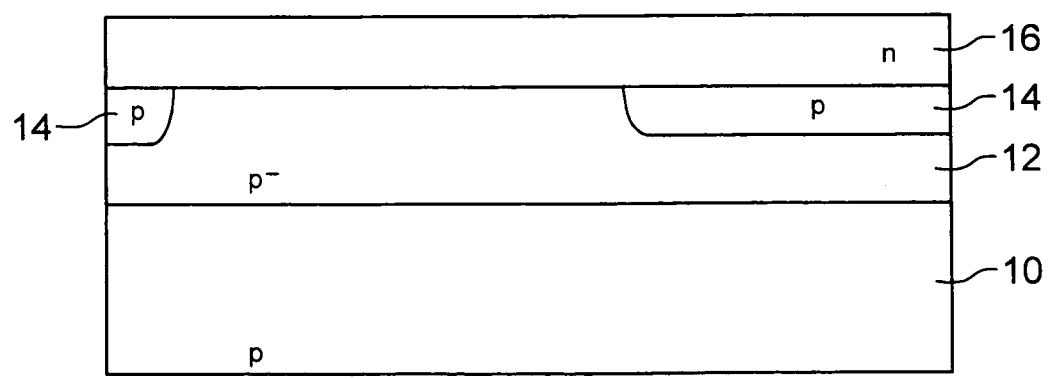
FIG. 2 is a partially enlarged cross-sectional view showing a manufacturing step of a method for manufacturing the optical semiconductor device in the embodiment according to the present invention.

As shown in FIG. 2, first, the p⁻-type epitaxial layer 12 is formed on the surface of the p-type semiconductor substrate 10. Next, the n-type epitaxial layer 16 is formed on the epitaxial layer 12. The epitaxial layers 12 and 16 can be formed by a vapor phase epitaxial growth method, a solid phase epitaxial growth method or the like. Prior to the formation of the epitaxial layer 16, the diffused layer 14 is formed in the epitaxial layer 12. In this embodiment, the semiconductor substrate 10 is a silicon substrate and the epitaxial layers 12 and 16 are both formed out of silicon single crystal.

Figure 3:
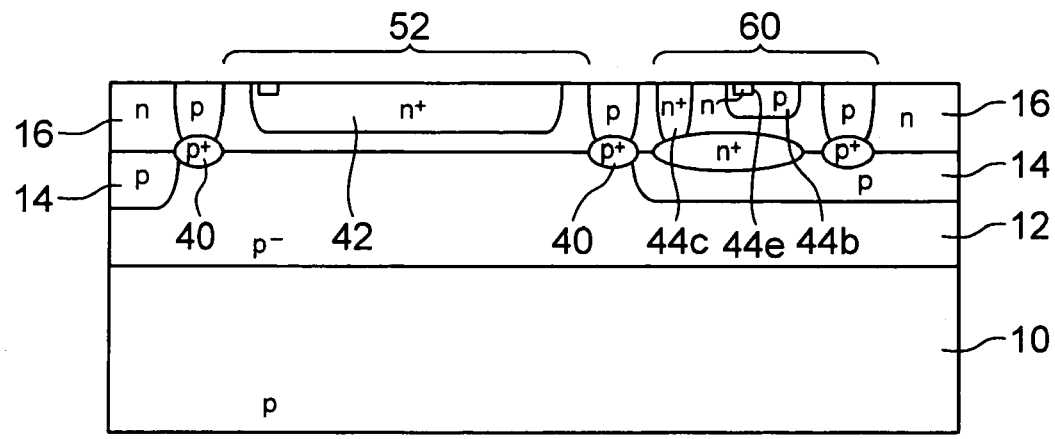
FIG. 3 is a cross-sectional view of the elements in a manufacturing step following the step shown in FIG. 2.

As shown in FIG. 3, such diffused layers as the element isolation layer 40 for isolating the photo detector section 52 from the signal-processing circuit section 60, the base layer 44b, emitter layer 44e and collector layer 44c for forming a bipolar transistor, and the lead layer 42 are next formed in the epitaxial layers 12 and 16. To form these diffused layers, impurities are selectively injected into the epitaxial layers 12 and 16 and a heat treatment is then conducted. The impurities are arsenic (As) or phosphorus (P) as n-type impurities, boron (B) as p-type impurities and the like.

Figure 4:
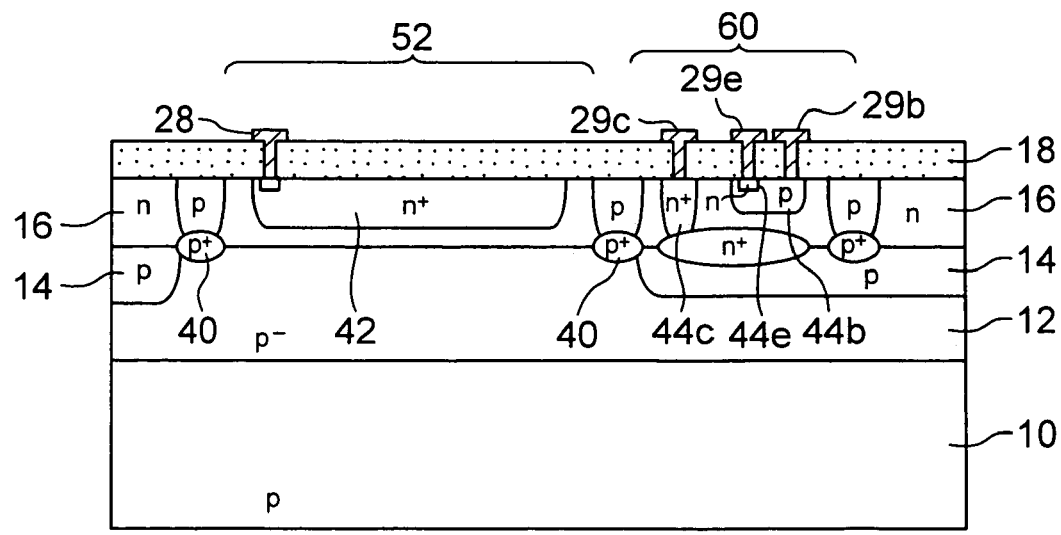
FIG. 4 is a cross-sectional view of the elements in a manufacturing step following the step shown in FIG. 3.

As shown in FIG. 4, the insulating film 18 is deposited by a CVD (Chemical Vapor Deposition) method or the like. The insulating film 18 is patterned by photolithography and etching. Further, a metal layer is formed by a sputtering method and then patterned. As a result, the electrodes 28, 29b, 29e and 29c are connected to the diffused layers 42, 44b, 44e and 44c, respectively. In this embodiment, the insulating film 18 is a silicon oxide film and the electrode 28 is made of copper, aluminum or the like.

Figure 5:
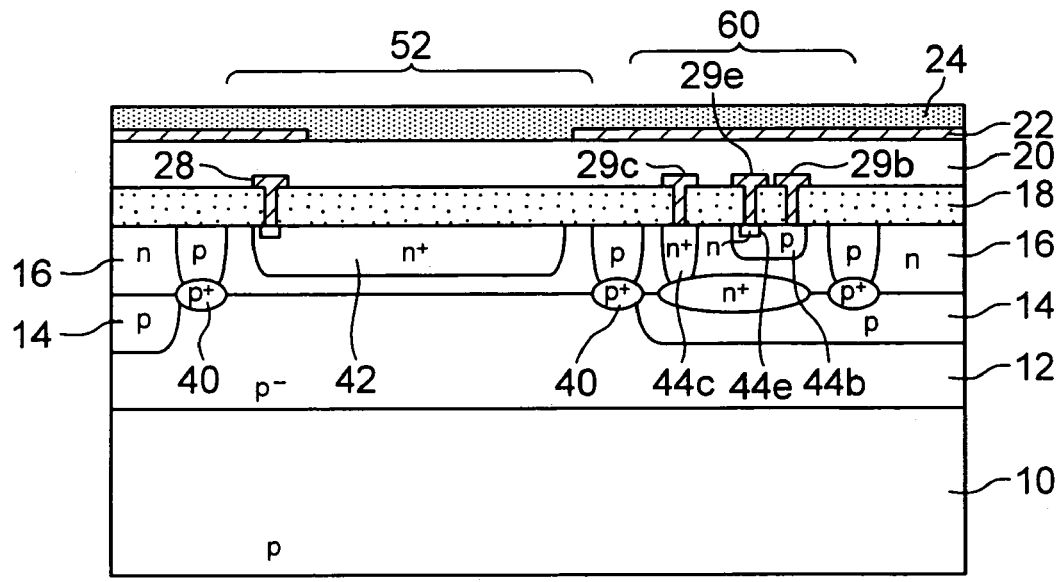
FIG. 5 is a cross-sectional view of the elements in a manufacturing step following the step shown in FIG. 4.

As shown in FIG. 5, the insulating film 20 is deposited to cover these electrodes 28, 29b, 29e and 29c by the CVD method or the like. In addition, the electrode layer 22 is formed on the insulating film 20. The electrode layer 22 shields the signal-processing circuit section 60 and the photo detector section 52 except for the light-receiving region 52a from incident light. The electrode layer 22 is often formed as one metal wiring layer of a multilayer wiring. The electrode layer 22 is formed by sputtering the metal film and removing the metal film from the light-receiving region 52a by the photolithography and etching. Further, the passivation film 24 is deposited on the electrode layer 22 and the insulating layer 20 by the CVD method or the like. In this embodiment, the insulating film 20 and the passivation film 24 are silicon oxide films and the electrode layer 22 is made of copper, aluminum or the like.

Figure 6:
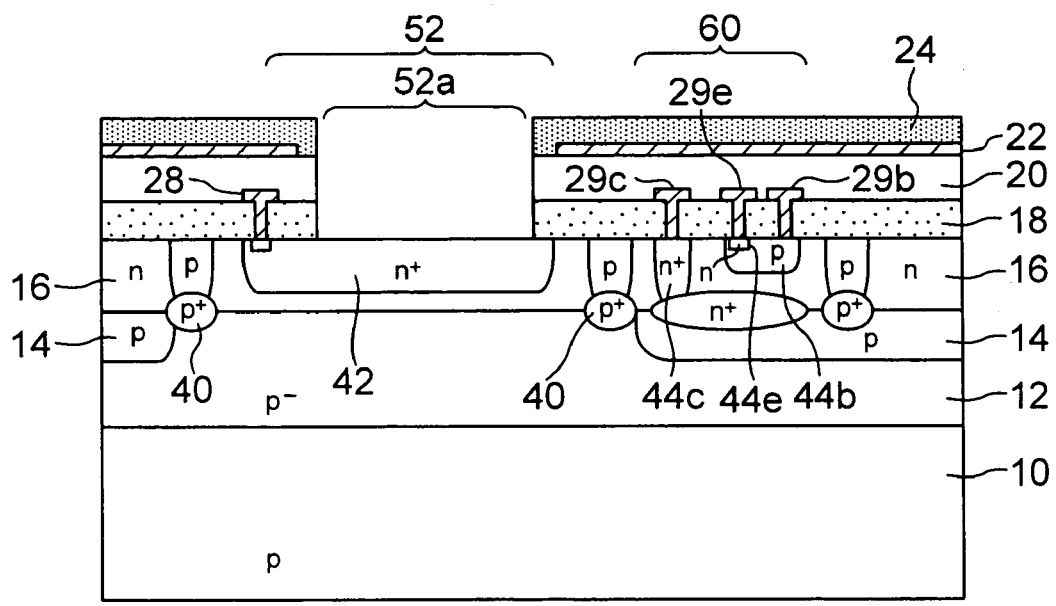
FIG. 6 is a cross-sectional view of the elements in a manufacturing step following the step shown in FIG. 5.

As shown in FIG. 6, the passivation film 24 and the insulating films 20 and 18 are removed from the light-receiving region 52a by the photolithography and etching. As a result, the surface of the epitaxial layer 16 in the light-receiving region 52a is exposed.

Alternatively, the epitaxial layer 16 in the light-receiving region 52a may be exposed by forming a plug in the light-receiving region 52a in advance, selectively depositing the insulating films 18 and 20, the electrode layer 22 and the passivation film 24 on the epitaxial layer 16 and then removing the plug.

Figure 7:
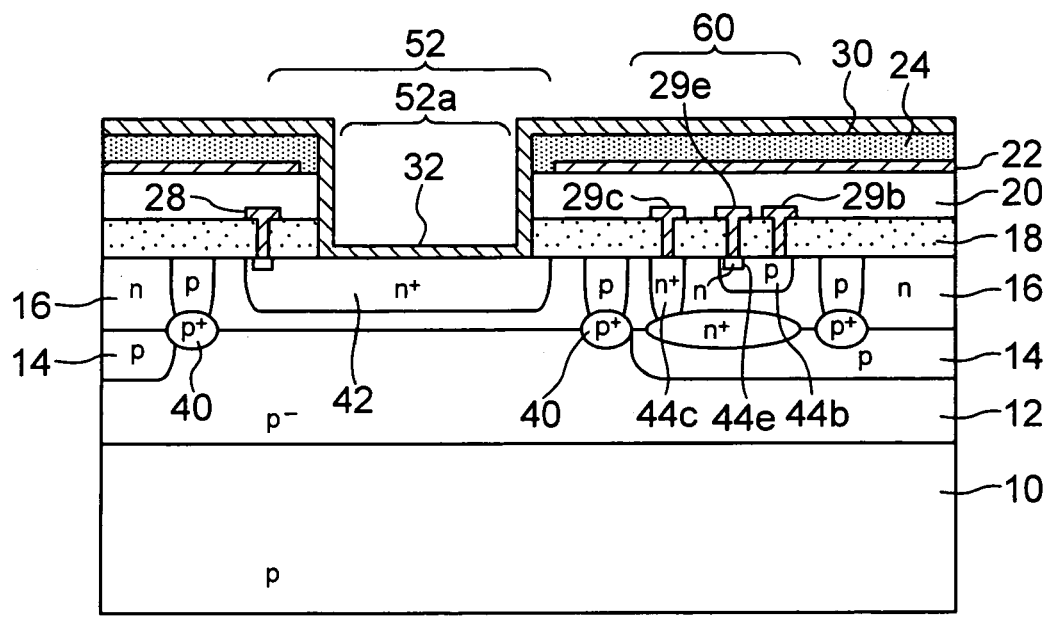
FIG. 7 is a cross-sectional view of the elements in a manufacturing step following the step shown in FIG. 6.

As shown in FIG. 7, the passivation film 30 and the antireflection film 32 are deposited so as to cover the signal-processing circuit section 60 and the photo detector section 52. The passivation film 30 covers the passivation film 24 in the signal-processing circuit section 60 and in the photo detector section 52 except for the light-receiving region 52a. The antireflection film 32 covers the surface of the exposed epitaxial layer 16 in the light-receiving region 52a. In this embodiment, the passivation film 30 and the antireflection film 32 are each formed out of a silicon nitride film. The passivation film 30 and the antireflection film 32 may be formed simultaneously in the same manufacturing step. The passivation film 30 and the antireflection film 32 may be deposited by, for example, an LP-CVD (Low-Pressure Chemical Vapor Deposition) method.

According to the method for manufacturing the optical semiconductor device in this embodiment, the passivation film 30 and the antireflection film 32 are formed simultaneously in the same manufacturing step. This makes it possible to easily manufacture the optical semiconductor device according to the present invention. More specifically, only a photolithographic step and an etching step are added so as to remove the films 24, 20 and 18 from the light-receiving region 52a. Therefore, according to the method for manufacturing the optical semiconductor device in this embodiment, it is possible to easily manufacture the optical semiconductor device according to the present invention and to hold down the manufacturing cost.

Further, according to the method for manufacturing the optical semiconductor device in this embodiment, the passivation film 30 and the antireflection film 32 are formed in the final step of the optical semiconductor device manufacturing steps. Due to this, no other film but the antireflection film 32 is formed on the antireflection film 32. In other words, the film formed on the epitaxial layer 16 is a single layer film consisting only of the antireflection film 32. It is thereby possible to determine the reflectance of the optical semiconductor device by the thickness of the antireflection film 32. In addition, by making only the antireflection film 32 thin, it is possible to decrease the variation of the reflectance.

Furthermore, since the passivation film 30 and the antireflection film 32 are formed simultaneously in the same manufacturing step, the films 30 and 32 also cover a sidewall which consists of the films 18, 20 and 24 provided on a boundary between the signal-processing circuit section 60 and the photo detector section 52. Therefore, the films 30 and 32 are formed to be continuous to each other. It is thereby possible to enable the passivation film 30 and the antireflection film 32 to function more effectively as passivation films.

Meanwhile, Japanese Patent Application Publication No. 4-271173 discloses an optical semiconductor device having a dielectric thin film and an antireflection film which have common properties and thickness and which are manufactured in a common manufacturing step. The dielectric thin film is used between the electrodes of the capacitor of a peripheral circuit element. The antireflection film is used in a photo detector.

In the optical semiconductor device disclosed in Publication No. 4-271173, the thickness of the antireflection film is a factor which determines the capacitance of the capacitor. Therefore, the thickness of the antireflection film is limited by the capacitance of the capacitor. If the thickness of the antireflection film is set at an optimum thickness in accordance with the wavelength of incident light, the areas of the electrodes of the capacitor have to be changed so as to obtain a desired capacitance. For example, it is sometimes necessary to set the electrode areas of the capacitor to be larger than those in an ordinary case in order to obtain the desired capacitance while maintaining the thickness d of the antireflection film which satisfies the expression 1.

In the optical semiconductor device disclosed in Publication No. 4-271173, the antireflection film of the photo detector is formed when the dielectric thin film used between the electrodes of the capacitor is formed. Due to this, such films as passivation films are formed on the antireflection film of the photo detector. As a result, in order to control the reflectance in the photo detector, it is disadvantageously necessary to control not only the thickness of the antireflection film but also those of the passivation films on the antireflection film.

In the optical semiconductor device 100 in the embodiment according to the present invention, by contrast, only the single layer film consisting of the antireflection film 32 exists on the epitaxial layer 16 in the photo detector section. Therefore, it suffices to control only the thickness of the antireflection film so as to control the reflectance of the photo detector. In addition, in the optical semiconductor device in the embodiment according to the present invention, the antireflection film 32 also functions as a passivation film, irrespectively of the capacitance of the capacitor. As a result, even if the antireflection film 32 maintains the thickness d which satisfies the expression 1, no problem occurs to the signal-processing circuit section 60 as the capacitor and the like.

As stated so far, according to the optical semiconductor device and the method for manufacturing the optical semiconductor device in this embodiment, even if the photo detector and the signal-processing circuit elements are formed on the same semiconductor substrate, it is possible to set the photo sensitivity of the optical semiconductor device higher than that of the conventional optical semiconductor device and to make the variation of the photo sensitivity smaller than that of the conventional optical semiconductor device.

According to the optical semiconductor device and the method for manufacturing the optical semiconductor device in this embodiment, even if the photo detector and the circuit elements are formed on the same semiconductor device, it is possible to control the photo sensitivity relatively easily without influencing the circuit elements.

According to the optical semiconductor device and the method for manufacturing the optical semiconductor device in this embodiment, it is possible to form the photo detector and the signal-processing circuit elements which have relatively high photo sensitivity and smaller range of the variation of the photo sensitivity, on the same semiconductor substrate.

What is claimed is:

1. A method for manufacturing an optical semiconductor device having a photo detector section to receive light and generate a photocurrent and a circuit element section to process a signal based on the photocurrent from said photo detector section on a same semiconductor substrate, the method comprising:
   forming a first semiconductor layer of a first conductivity type on a surface of the semiconductor substrate;
   forming a second semiconductor layer of a second conductivity type on a surface of said first semiconductor layer;
   forming selectively diffused layers in said second semiconductor layer in said photo detector section and said circuit element section;
   depositing a first insulating film on said second semiconductor layer;
   exposing said second semiconductor layer in a light-receiving region which receives the light in said photo detector section; and
   forming an antireflection film on said second semiconductor layer in said light-receiving region, and forming a passivation film above said first insulating film, said antireflection film preventing a reflection of an incident light, said passivation film being made of a same material as a material of said antireflection film and covering said circuit element section, and said antireflection film being continuous with said passivation film.

2. A method for manufacturing an optical semiconductor device according to claim 1, wherein said antireflection film and said passivation film are formed simultaneously in a same manufacturing step.

3. A method for manufacturing an optical semiconductor device according to claim 2, wherein said antireflection film and said passivation film are formed in the final step of the optical semiconductor manufacturing step.

4. A method for manufacturing an optical semiconductor device according to claim 3, wherein each of said antireflection film and said passivation film is a silicon nitride film.

5. A method for manufacturing an optical semiconductor device according to claim 4, wherein said antireflection film and said passivation film are deposited by a CVD method.

6. A method for manufacturing an optical semiconductor device according to claim 1, wherein each of said antireflection film and said passivation film is a silicon nitride film.

7. A method for manufacturing an optical semiconductor device having a photo detector section to receive light and generate a photocurrent and a circuit element section to process a signal based on the photocurrent from said photo detector section on a same semiconductor substrate, the method comprising:
   forming a first semiconductor layer of a first conductivity type on a surface of the semiconductor substrate;
   forming a second semiconductor layer of a second conductivity type on a surface of said first semiconductor layer;
   forming selectively diffused layers in said second semiconductor layer in said photo detector section and said circuit element section;
   depositing a first insulating film on said second semiconductor layer;
   patterning said first insulating film, and forming electrodes connected to said diffused layers;
   depositing a second insulating film covering said electrodes;
   forming at least one electrode layer on said second insulating film, said electrode layer being electrically connected to one of said electrodes;
   exposing said second semiconductor layer in a light-receiving region which receives the light in said photo detector section by etching said first insulating film and said second insulating film which are present in said light-receiving region; and
   forming an antireflection film on said second semiconductor layer in said light-receiving region, and forming a passivation film above said first insulating film, said antireflection film preventing a reflection of an incident light, said passivation film being made of a same material as a material of said antireflection film and covering said circuit element section, and said antireflection film being continuous with said passivation film.

8. A method for manufacturing an optical semiconductor device according to claim 7, wherein said antireflection film and said passivation film are formed simultaneously in a same manufacturing step.

9. A method for manufacturing an optical semiconductor device according to claim 8, wherein said antireflection film and said passivation film are formed in the final step of the optical semiconductor manufacturing step.

10. A method for manufacturing an optical semiconductor device according to claim 9, wherein each of said antireflection film and said passivation film is a silicon nitride film.

11. A method for manufacturing an optical semiconductor device according to claim 10, wherein said antireflection film and said passivation film are deposited by a CVD method.

12. A method for manufacturing an optical semiconductor device according to claim 7, wherein each of said antireflection film and said passivation film is a silicon nitride film.

13. A method for manufacturing an optical semiconductor device according to claim 7, wherein said antireflection film and said passivation film are deposited by a CVD method.

14. A method for manufacturing an optical semiconductor device having a photo detector section to receive light and generate a photocurrent and a circuit element section to process a signal based on the photocurrent from said photo detector section on a same semiconductor substrate, the method comprising:
   forming a first semiconductor layer of a first conductivity type on a surface of the semiconductor substrate;
   forming a second semiconductor layer of a second conductivity type on a surface of said first semiconductor layer;
   forming selectively diffused layers in said second semiconductor layer in said photo detector section and said circuit element section;
   depositing a first insulating film on said second semiconductor layer;
   exposing said second semiconductor layer in a light-receiving region which receives the light in said photo detector section; and
   forming a single layer film on said circuit element section and said photo detector section, said single layer film acting as an antireflection film preventing a reflection of an incident light in said light-receiving region and acting as a passivation film protecting the circuit element in said circuit element section.

15. A method for manufacturing an optical semiconductor device according to claim 14, wherein said antireflection film and said passivation film are formed simultaneously in a same manufacturing step.

16. A method for manufacturing an optical semiconductor device according to claim 15, wherein said antireflection film and said passivation film are formed in the final step of the optical semiconductor manufacturing step.

17. A method for manufacturing an optical semiconductor device according to claim 16, wherein each of said antireflection film and said passivation film is a silicon nitride film.

18. A method for manufacturing an optical semiconductor device according to claim 17, wherein said antireflection film and said passivation film are deposited by a CVD method.

19. A method for manufacturing an optical semiconductor device according to claim 14, wherein each of said antireflection film and said passivation film is a silicon nitride film.

20. A method for manufacturing an optical semiconductor device according to claim 14, wherein said antireflection film and said passivation film are deposited by a CVD method.

* * * * *